United States Patent
Shih

(10) Patent No.: US 10,999,948 B2
(45) Date of Patent: May 4, 2021

(54) ELECTRONIC DEVICE AND SUPPORTING MEMBER THEREOF

(71) Applicants: Inventec (Pudong) Technology Corporation, Shanghai (CN); INVENTEC CORPORATION, Taipei (TW)

(72) Inventor: Ming-Hung Shih, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/575,415

(22) Filed: Sep. 19, 2019

(65) Prior Publication Data
US 2021/0076526 A1 Mar. 11, 2021

(30) Foreign Application Priority Data
Sep. 6, 2019 (CN) .......................... 201910842002.8

(51) Int. Cl.
*H05K 7/14* (2006.01)
*H05K 5/02* (2006.01)
*H05K 5/00* (2006.01)

(52) U.S. Cl.
CPC ......... *H05K 7/1422* (2013.01); *H05K 5/0073* (2013.01); *H05K 5/0204* (2013.01); *H05K 7/1417* (2013.01); *H05K 5/0008* (2013.01)

(58) Field of Classification Search
CPC .. H05K 7/1422; H05K 5/0204; H05K 5/0073; H05K 7/1417; H05K 5/0008
See application file for complete search history.

(56) References Cited

U.S. PATENT DOCUMENTS

| | | | | |
|---|---|---|---|---|
| 7,134,895 B1* | 11/2006 | Choy | ................... | H05K 7/1404 439/326 |
| 7,391,619 B1* | 6/2008 | Lee | ....................... | H05K 7/1417 361/726 |
| 7,654,831 B1* | 2/2010 | Wu | ..................... | H01R 13/6593 439/76.1 |
| 9,955,595 B2* | 4/2018 | Terakawa | ............. | H05K 7/1417 |
| 2004/0152353 A1* | 8/2004 | Kawamae | ............ | H01R 12/721 439/328 |
| 2006/0189196 A1* | 8/2006 | Kameda | .................. | H01R 12/83 439/326 |
| 2009/0093136 A1* | 4/2009 | Hiew | .................... | H05K 5/0278 439/55 |
| 2009/0197438 A1* | 8/2009 | Liu | .................. | H01R 13/65914 439/76.1 |
| 2010/0195304 A1* | 8/2010 | Takao | .................... | G06F 1/1616 361/804 |

(Continued)

*Primary Examiner* — Adrian S Wilson
*Assistant Examiner* — Theron S Milliser
(74) *Attorney, Agent, or Firm* — CRC & Partners Co., LLC

(57) ABSTRACT

A supporting member includes a body portion, at least one first fixing portion, and at least one second fixing portion. The first fixing portion is connected to a side of the body portion and bends relative to the body portion. The first fixing portion is configured to be fixed to a first circuit board. The second fixing portion is connected to another side of the body portion and bends relative to the body portion. The second fixing portion is configured to be fixed to a second circuit board.

8 Claims, 3 Drawing Sheets

(56) References Cited

U.S. PATENT DOCUMENTS

2010/0248544 A1* 9/2010 Xu ................... H01R 13/6585
                                                    439/607.04
2015/0313035 A1* 10/2015 Kroeckel ............... H05K 5/006
                                                    361/759

* cited by examiner

ELECTRONIC DEVICE AND SUPPORTING
MEMBER THEREOF

CROSS-REFERENCE TO RELATED
APPLICATION

This application claims priority to China Application Serial Number 201910842002.8, filed Sep. 6, 2019 which is herein incorporated by reference in its entirety.

BACKGROUND

Field of Invention

The present invention relates to an electronic device. More particularly, the present invention relates to the electronic device that suppresses bending deformation of a circuit board.

Description of Related Art

With an advent of technology, functional requirements for an electronic device are increasing. To meet the expectations of the public, a number of circuit board installed in the electronic device is increased also. On the other hand, to simplify the size of the electronic device, a configuration of the plurality of circuit boards is usually disposed in the electronic device in a stacked manner.

Currently, a circuit board above an underlying circuit board is usually screwed to the underlying circuit board. However, during the locking process, the locking force of the locking accessories tends to cause the circuit board to bend and result in breakage of a circuit on the circuit board or destruction of electronic components mounted on the circuit board.

In addition, due to the bending deformation of the circuit board, there is tolerance between each layer of the circuit board. Accumulation of the tolerances among these stacked circuit boards will result in poor contact between the circuit board and a heat dissipating component leading poor heat dissipation.

Accordingly, how to provide a supporting member and an electronic device to solve the aforementioned problems becomes an important issue to be solved by those in the industry.

SUMMARY

The invention provides a supporting member able to strengthen a structural strength of a circuit board and an electronic device using the supporting member to enhance the overall assembly strength.

According to an embodiment of the discourse, the supporting member includes a body portion, at least one first fixing portion, and at least one second fixing portion. The first fixing portion is connected to a side of the body portion and bends relative to the body portion. The first fixing portion is configured to be fixed to a first circuit board. The second fixing portion is connected to another side of the body portion and bends relative to the body portion. The second fixing portion is configured to be fixed to a second circuit board.

In an embodiment of the disclosure, the supporting member further includes a foot. The foot is coupled to the body portion. The foot is configured to be inserted into the first circuit board.

In an embodiment of the disclosure, the foot is coupled to the body portion through the second fixing portion. The foot bends relative to the second fixing portion. The first fixing portion has a supporting surface. The supporting surface is configured to be abutted to the first circuit board. The foot extends beyond the supporting surface of the first fixing portion.

In an embodiment of the disclosure, the foot is coupled to the body portion through the second fixing portion. The foot is opposite to the body portion.

In an embodiment of the disclosure, the first fixing portion and the second fixing portion have a first fixing hole and a second fixing hole respectively. The second fixing portion further has a through hole. The through hole is aligned with the first fixing hole in a direction in which the first fixing portion and the second fixing portion are arranged.

In an embodiment of the disclosure, an aperture of the through hole is greater than an aperture of the first fixing hole.

In an embodiment of the disclosure, the first fixing portion and the second fixing portion extend toward a same direction relative to the body portion.

In an embodiment of the disclosure, a number of the at least one first fixing portion is plural.

In an embodiment of the disclosure, a number of the at least one second fixing portion is plural.

According to another embodiment of the disclosure, an electronic device includes the supporting member described above, a first circuit board, and a second circuit board. The first circuit board is fixed to the supporting member through the first fixing portion of the supporting member. The body portion of the supporting member extends along a side of the first circuit board. The second circuit board is fixed to the supporting member through the second fixing portion of the supporting member.

Accordingly, the electronic device of the disclosure is provided with the supporting member installed on one side of the circuit board. The structural strength of the circuit board is reinforced by the body portion, the first fixing portion, and the foot of the supporting member to suppress the bending of the circuit board. Further, the second fixing hole provided by the second fixing portion can be used to fix another circuit board to increase the flexibility of assembly of the electronic device.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
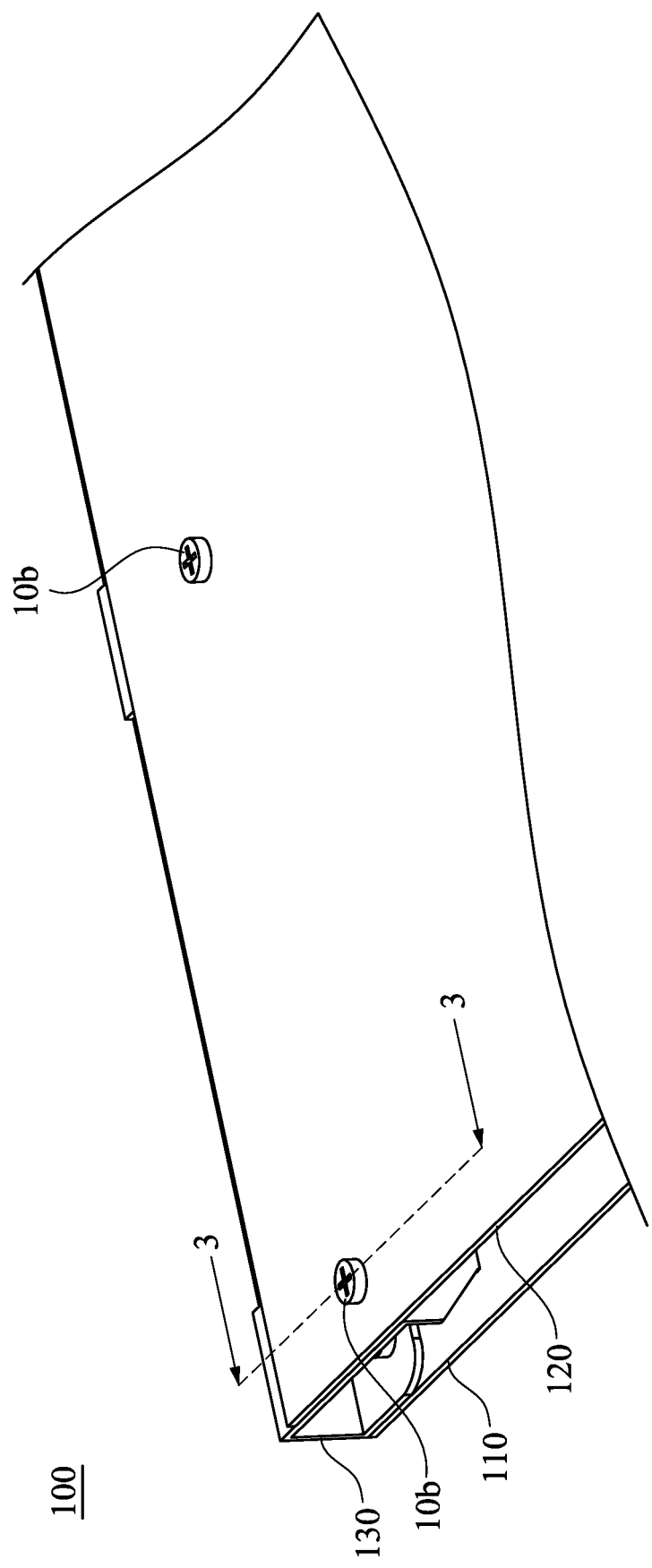
FIG. 1 is a partial perspective view of an electronic device according to an embodiment of the disclosure.

Reference will now be made in detail to the present embodiments of the invention, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the invention.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

Reference is made to FIG. 1. FIG. 1 is a partial perspective view of an electronic device 100 according to an embodiment of the disclosure. As shown in FIG. 1, the electronic device 100 of the disclosure can be a computer device such as a computer or a server, but the disclosure is not limited in this regard. The electronic device 100 includes a first circuit board 110, a second circuit board 120, and a supporting member 130. The supporting member 130 is disposed between the first circuit board 110 and a second circuit board 120. The second circuit board 120 is fixed to the first circuit board 110 via the supporting member 130.

Figure 2:
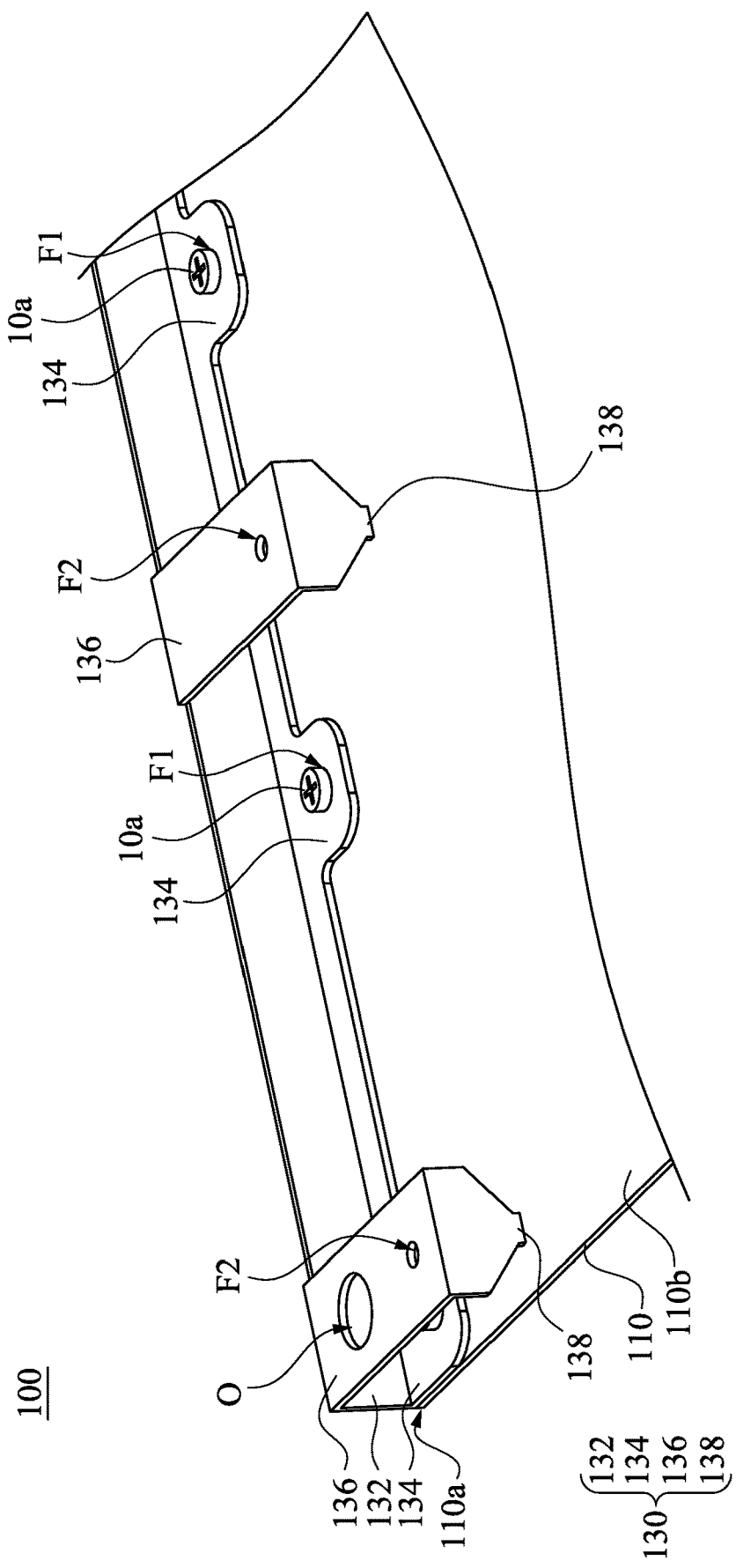
FIG. 2 is a partial perspective view of the electronic device in FIG. 1, wherein a second circuit board is not shown.

Reference is made to FIG. 2. FIG. 2 is a partial perspective view of the electronic device 100 in FIG. 1, wherein the second circuit board 120 is not shown. As shown in FIG. 2, the supporting member 130 includes a body portion 132, a plurality of first fixing portion 134, a plurality of second fixing portion 136, and feet 138. The supporting member 130 is disposed on a side 110a of the first circuit board 110. The body portion 132 of the supporting member 130 extends along the side 110a of the first circuit board 110. Further, the body portion 132 is substantially perpendicular to the board surface 110b of the first circuit board 110. As such, the body portion 132 can strengthen structures of the first circuit board and the second circuit board (as shown in FIG. 1) to suppress bending deformation of the first circuit board 110 and the second circuit board 120.

The first fixing portion 134 is connected to a side of the body portion 132 close to the first circuit board 110. The second fixing portion 136 is connected to a side of the body portion 132 away from the first circuit board 110. The first fixing portion 134 and the second fixing portion 136 bend toward a same direction relative to the body portion 132.

In some embodiments, the first fixing portion 134 is opposite to the second fixing portion 136. In another embodiment, the first fixing portion 134 is not opposite to the second fixing portion 136, but the disclosure is not limited in this regard. Specifically, in some embodiments, the first fixing portion 134 and the second fixing portion 136 are aligned in a direction perpendicular to the board surface 110b of the first circuit board 110. In other embodiments, the first fixing portion 134 and the second fixing portion 136 is not aligned in the direction perpendicular to the board surface 110b.

Further, the first fixing portion 134 has a first fixing hole F1. The first fixing hole F1 is configured to be passed through by the locking member 10a so as to fix the first fixing portion 134 to the first circuit board 110. The second fixing portion 136 has a second fixing hole F2. The second fixing hole F2 is configured to be passed through by another locking member 10b so as to fix the second fixing portion 136 to the second circuit board 120. In some embodiments, the second fixing portion 136 opposite to the first fixing portion 134 further has a through hole O. The configuration of the through hole O will be described in more detail in the description of FIG. 3 below.

The feet 138 are connected to ends of the corresponding second fixing portions 136 away from the body portion 132 respectively. The feet 138 bend relative to the second fixing portions 136. Specifically, the feet 138 bend and extend toward the first circuit board 110 relative to the first circuit board 110 such that the feet 138 are opposite to the body portion 132.

Figure 3:
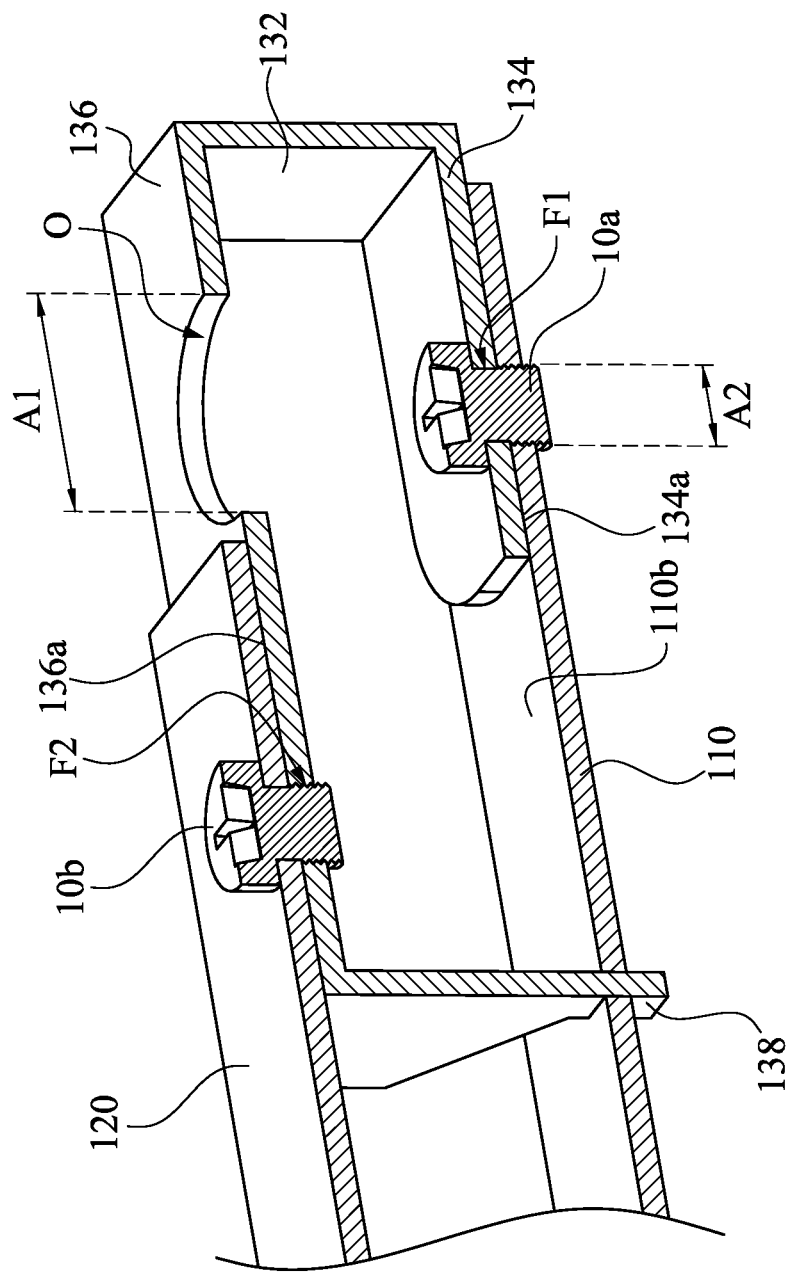
FIG. 3 is a partial cross-section view of the electronic device taken along line 3-3 in FIG. 1.

Reference is made to FIG. 3. FIG. 3 is a partial cross-section view of the electronic device 100 taken along line 3-3 in FIG. 1. As shown in FIG. 3, in the embodiment, the first fixing portion 134 is opposite to the second fixing portion 136 in the direction perpendicular to the board surface 110b of the first circuit board 110. Further, the through hole O of the second fixing portion 136 is aligned with the first fixing hole F1 of the first fixing portion 134 in a direction in which the first fixing portion 134 and the second fixing portion 136 are arranged, i.e., the direction perpendicular to the board surface 110b of the first circuit board 110. Also, an aperture A1 of the through hole O is greater than an aperture A2 of the first fixing hole F1. In this way, the locking member 10a can pass through the through hole O and the first fixing hole F1 sequentially from the above of the second fixing portion 136, and be inserted into a locking hole of the first circuit board 110. Moreover, a locking tool, for example a screw driver, can also pass through the through hole O to rotate the locking member 10a, and thereby fixing the first circuit board 110 and the first fixing portion 134 by the locking member 10a.

The first fixing portion 134 has a first supporting surface 134a. The first supporting surface 134a is abutted to the board surface 110b of the first circuit board 110. The first supporting surface 134a helps to suppress the bending deformation of the first circuit board 110 to prevent the first circuit board 110 from bending. The feet 138 extend toward the first circuit board 110 relative to the second fixing portion 136, and exceed the first supporting surface 134a. Accordingly, the feet 138 are substantially partially inserted into the first circuit board 110. By inserting the feet 138 into the first circuit board 110, the tin area between the feet 138 and the first circuit board 110 can be increased, and the strength of the first circuit board 110 can be enhanced to suppress the bending of the first circuit board 110.

The second fixing portion 136 has a second supporting surface 136a. The second supporting surface 136a is located at a side of the second fixing portion 136 away from the first circuit board 110. The second circuit board 120 is abutted to the second supporting surface 136a of the second fixing portion 136. With the support of the second supporting surface 136a, the structural strength of the second circuit board 120 can be increased, and the probability of bending deformation of the second circuit board 120 is reduced. The locking member 10b passes through a locking hole of the second circuit board 120 and the second fixing portion F2 of the second fixing portion 136 so as to fix the second circuit board 120 to the second fixing portion 136. In the embodiment, the second fixing hole F2 has an internal thread. Accordingly, the second circuit board 120 and the second fixing portion 136 can be fixed by means of screw locking. Further, the feet 138 is located below the second circuit board 120 and extend perpendicularly relative to the second circuit board 120. As such, the feet 138 can assist the second fixing portion 136 to support the second circuit board 120, and to prevent the second fixing portion 136 from being bent toward the first circuit board 110.

In some embodiments, numbers and positions of the first fixing portion 134 and the second fixing portion 136 can be adjusted according to actual needs. The disclosure should not be limited in this regard. Specifically, the numbers and positions of the first fixing portion 134 and the second fixing portion 136 can be disposed in cooperation with the locking holes of the first circuit board 110 and the second circuit board 120 to increase the flexibility of assembly of the electronic device 100.

According to the foregoing recitations of the embodiments of the disclosure, it can be seen that the electronic device of the disclosure is provided with the supporting member installed on one side of the circuit board. The structural strength of the circuit board is reinforced by the body portion, the first fixing portion, and the foot of the supporting member to suppress the bending of the circuit board. Further, the second fixing hole provided by the second fixing portion can be used to fix another circuit board to increase the flexibility of assembly of the electronic device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A supporting member, comprising:
   a body portion;
   at least one first fixing portion connected to a side of the body portion, bending relative to the body portion, and configured to be fixed to a first circuit board, the first fixing portion has a first supporting surface configured to be abutted to the first circuit board;
   at least one second fixing portion connected to another side of the body portion, bending relative to the body portion, and configured to be fixed to a second circuit board, the second fixing portion having a second supporting surface located at a side of the second fixing portion away from the first circuit board, the second fixing surface being configured to be abutted to the second circuit board; and
   a foot coupled to the body portion through an end of the second fixing portion away from the body portion, the foot bending relative to the end of the second fixing portion and extending towards the first circuit board such that the foot is opposite to the body portion, the foot extending beyond the first supporting surface of the first fixing portion and being configured to be inserted into the first circuit board,
   wherein the first fixing portion and the second fixing portion have a first fixing hole and a second fixing hole respectively, the second fixing portion further has a through hole aligned with the first fixing hole in a direction in which the first fixing portion and the second fixing portion are arranged, and an aperture of the through hole is greater than an aperture of the first fixing hole so that a locking member can pass through the through hole and the first fixing hole and thereby fixing the first circuit board and the first fixing portion by the locking member.

2. The supporting member of claim 1, wherein the first fixing portion and the second fixing portion extend toward a same direction relative to the body portion.

3. The supporting member of claim 1, wherein a number of the at least one first fixing portion is plural.

4. The supporting member of claim 1, wherein a number of the at least one second fixing portion is plural.

5. An electronic device, comprising:
   a supporting member comprising:
      a body portion;
      at least one first fixing portion connected to a side of the body portion and bending relative to the body portion, the first fixing portion having a first supporting surface;
      at least one second fixing portion connected to another side of the body portion and bending relative to the body portion, the second fixing portion having a second supporting surface; and
      a foot coupled to the body portion through an end of the second fixing portion away from the body portion, the foot bending relative to the end of the second fixing portion and extending towards the first circuit board such that the foot is opposite to the body portion, the foot extending beyond the first supporting surface of the first fixing portion;
   a first circuit board fixed to the supporting member through the first fixing portion of the supporting member, the body portion of the supporting member extending along a side of the first circuit board, the foot being configured to be inserted into the first circuit board, the first supporting surface being configured to be abutted to the first circuit board; and
   a second circuit board fixed to the supporting member through the second fixing portion of the supporting member, the second supporting surface being located at a side of the second fixing portion away from the first circuit board and the second fixing surface being configured to be abutted to the second circuit board,
   wherein the first fixing portion and the second fixing portion have a first fixing hole and a second fixing hole respectively, the second fixing portion further has a through hole aligned with the first fixing hole in a direction in which the first fixing portion and the second fixing portion are arranged, and an aperture of the through hole is greater than an aperture of the first fixing hole so that a locking member can pass through the through hole and the first fixing hole and thereby fixing the first circuit board and the first fixing portion by the locking member.

6. The electronic device of claim 5, wherein the first fixing portion and the second fixing portion extend toward a same direction relative to the body portion.

7. The electronic device of claim 5, wherein a number of the at least one first fixing portion is plural.

8. The electronic device of claim 5, wherein a number of the at least one second fixing portion is plural.

\* \* \* \* \*